United States Patent
Austin et al.

[11] Patent Number: 5,200,631
[45] Date of Patent: Apr. 6, 1993

[54] HIGH SPEED OPTICAL INTERCONNECT

[75] Inventors: Francis D. Austin, Haymarket; Richard Kachmarik, Bealeton; Leonard T. Olson, Centreville, all of Va.

[73] Assignee: International Business Machines Corporation, Armonk, N.Y.

[21] Appl. No.: 740,742

[22] Filed: Aug. 6, 1991

[51] Int. Cl.$^5$ .................. H01L 31/12; H01L 31/16
[52] U.S. Cl. .................................. 257/81; 257/433; 257/686; 361/412; 385/14
[58] Field of Search ............. 357/19, 30 L, 30 M, 357/74, 75, 76; 361/393, 396, 412, 413; 437/208; 385/14

[56] References Cited

U.S. PATENT DOCUMENTS

| | | | |
|---|---|---|---|
| 3,429,040 | 2/1969 | Miller. | |
| 4,070,516 | 1/1978 | Kaiser | 385/14 |
| 4,169,001 | 9/1979 | Kaiser | 385/14 |
| 4,573,067 | 2/1986 | Tuckerman et al. | 357/82 |
| 4,626,878 | 12/1986 | Kuwano et al. | 357/19 |
| 4,699,449 | 10/1987 | Lam et al. | 385/14 |
| 4,729,618 | 3/1988 | Yoshida et al. | 385/14 |
| 4,758,063 | 7/1988 | Konechny, Jr. | 385/14 |
| 4,871,224 | 10/1989 | Karstensen et al. | 385/14 |
| 4,966,430 | 10/1990 | Weidel | 385/14 |
| 5,049,982 | 9/1991 | Lee et al. | 357/75 |

FOREIGN PATENT DOCUMENTS

| | | | |
|---|---|---|---|
| 0304263 | 2/1989 | European Pat. Off. | 357/75 |
| 37-13067 | 3/1988 | Fed. Rep. of Germany | 357/19 |
| 55-56672 | 4/1980 | Japan | 357/19 |
| 56-6479 | 1/1981 | Japan | 357/19 |
| 58-86765 | 5/1983 | Japan | 357/19 |
| 58-90764 | 5/1983 | Japan | 357/19 |
| 58-93267 | 6/1983 | Japan | 357/19 |
| 58-95861 | 6/1983 | Japan | 357/19 |
| 58-100468 | 6/1983 | Japan | 357/19 |
| 60-70404 | 4/1985 | Japan | 385/14 |
| 60-191206 | 9/1985 | Japan | 385/14 |
| 61-36982 | 2/1986 | Japan | 357/19 |
| 61-255047 | 11/1986 | Japan | 357/19 |
| 62-145760 | 6/1987 | Japan | 357/19 |
| 62-291078 | 12/1987 | Japan | 357/19 |
| 2-90576 | 3/1990 | Japan | 357/19 |
| 2-262357 | 10/1990 | Japan | 357/19 |

OTHER PUBLICATIONS

Rogers, "Chip Joining both sides of substrates simultaneously", IBM Tech. Disc. Bulletin, vol. 13, No. 2, Jul. 1970.

Primary Examiner—Rolf Hille
Assistant Examiner—Minhloan Tran
Attorney, Agent, or Firm—Jeffrey S. LaBaw; Mark A. Wurm

[57] ABSTRACT

An optoelectronic package with direct free space optical communication between pairs of optical transmitters and receivers located on different substrate surfaces in a closely spaced stack of chip carrying substrates is disclosed. The transmitters and receivers are aligned so that a light beam from each transmitter follows an optical path toward its respective receiver. In the stack of substrates, the transmitters and receivers are mounted on the surfaces of the substrates, many of which are separated by intervening substrates. These intervening substrates have vias, holes or transparent regions, or other optical means, at locations along the optical paths connecting the transmitters and receivers. Lenses or other concentrating means, where required, are adjacent to a transmitter so that its diverging light is focused on the intended receiver. Substrates are aligned so that the light from transmitters shines through the optical means in intervening substrates to the receivers. Means for removing heat from the substrates are included.

16 Claims, 7 Drawing Sheets

HIGH SPEED OPTICAL INTERCONNECT

BACKGROUND OF THE INVENTION

This invention generally relates to interconnecting semiconductor chips. More particularly, it relates to an apparatus for optical communication between chips located on distinct substrate surfaces.

There is a continuing effort to increase the speed of electronic circuitry, both by increasing the speed of the devices themselves and by shortening the electrical paths between devices providing more circuits on a single chip and more chips on a single substrate. However, despite these efforts at miniaturization, as electronic components have become faster, the speed of electronic equipment, such as a computer, is increasingly limited by the time required for electronic signals to travel from one component to another within the machine and by the broadening of electric pulses as the signals travel in conductive media.

To speed signaling, there is an increased desire to replace electronic signals with optical signals for communication among components. Light is not affected by transmission line delay, by resistance-capacitance delay, or by inductance delay. Thus, the transit time between components is reduced. Also, because the signal shape suffers little degradation, the data rate is significantly higher for optical communication than for electronic communication. For example, for short range communication, the data rate is limited to about 70 to 85 Mb/s in aluminum conductors; using copper conductors, speed can be boosted to about 100 to 125 Mb/s. Yet optical transmission currently allows data rates of about 20 Gb/s, 200 times faster.

Optical signal transmission has other advantages as well, including immunity to electromagnetic interference and electromagnetic pulses which can disrupt electrical transmission, as well as electrical isolation, reduced power consumption, and higher reliability because of fewer electrical contacts.

In the prior art approaches to optical communication, the optical signal is generally carried in an optical fiber or waveguide. Optical fiber has won widespread acceptance in part because light energy can, at a high data rate, be efficiently coupled into or out of the optical fiber, transmitted in any direction and around any obstacles, split into several signals, and carried for long distances with little dispersion or attenuation. Optical fiber possesses clear advantages in medium- and long-range optical communication. Optical fiber links interconnecting computer processors and peripherals are commercially available. However, for very short-range communication, as attenuation of the signal is not an important factor, the use of optical fiber is not particularly advantageous because of the difficulty and complexity in making optical fiber connections at small dimensions.

Surface waveguide has been introduced for short-range communication between semiconductor chips on the same substrate surface. Waveguide can be fabricated on the substrate surface using many of the same lithography techniques used in semiconductor fabrication, and therefore, the optical connections are much more easily integrated into the substrate.

One way of arranging a plurality of substrates bearing semiconductor chips in a minimum space would be in a closely spaced, stacked assembly. Electrical bus structures could provide power and communication between the substrates. However, neither surface waveguides nor optical fibers provide the optimum means of optical communication between the substrates. For communication between distinct substrate surfaces, a surface waveguide is not a viable solution as it would find no mechanical support. Interconnecting a closely spaced stack of substrates with a plurality of optical fibers connected to different substrates would pose severe mechanical problems and may add enormous and unnecessary complexity and cost.

The present invention proposes the use of free space optical communication to solve these problems. The term free space generally includes gaseous media like air, which have an index of refraction approximately equal to 1.

Free space optical communication is known in the art, arguably being presaged by the smoke signals of the American West. Free space has been cited in the literature as advantageous for short distance data communication among adjacent computers. Where there are no obstacles in the optical path, free space optical communication offers a far simpler and cheaper signal medium. In addition, light travels 50% more slowly in either fiber or surface wave guide than in free space. However, in a closely spaced stack of substrates, each intervening substrate presents an obstacle to optical communication between nonadjacent, nonfacing substrate surfaces. Optical transmitters and receivers could be placed at the edges of the substrates, but as substrates get large, communication would be increasingly limited by the time required for the electrical signals to travel from chip to edge of the substrates.

SUMMARY OF THE INVENTION

It is an object of the present invention to communicate with light between nearby components without optical fiber or waveguide.

It is another object of the present invention to transmit light signals between a transmitter located on one substrate surface and a receiver located on a second substrate surface without the use of optical fiber or waveguide.

It is another object of the present invention to transmit light through intervening substrates between the transmitter and receiver so that the optical signal can pass with little attenuation or reflection.

These and other objects of the invention are accomplished by direct free space optical communication between pairs of optical transmitters and receivers located on different substrate surfaces in a closely spaced stack of chip carrying substrates. The transmitters and receivers are aligned so that a light beam from each transmitter follows an optical path toward its respective receiver. The optical path is preferably along a straight line, although some embodiments of the invention call for deflection by reflection, refraction, or diffraction at one or more of the substrate surfaces. In the stack of substrates, the transmitters and receivers are mounted on the surfaces of the substrates, many of which are separated by intervening substrates. These intervening substrates have vias, holes or transparent regions, or other optical means, at locations along the optical paths connecting the transmitters and receivers. Some of the intervening substrates preferably have transmitters and receivers mounted thereon. Lenses, where required, are adjacent to a transmitter so that its diverging light is focused on the intended receiver. Substrates are aligned so that the light from transmitters passes through the optical means in intervening substrates to receivers. Means for removing heat from the substrates are included.

In one embodiment of the invention, funnel shaped laser drilled holes with reflective walls form vias in the intervening silicon substrates. The substrates are organized in a stack by means of a substrate and board supporting frame. The light emitting surface of the transmitters and and the light detecting surface of the receivers face each other along the optical path. Vias in intervening substrates are provided as necessary to allow the optical signals to pass from transmitter to receiver. Transmitters are vertical cavity top surface-emitting GaAs quantum well lasers, and lenses focus the emitted beams through the vias onto photodiode receivers. Before locking the substrates into position, the position of the substrates is adjusted so the maximum light intensity reaches the receivers through the vias. Heat is removed by conduction through the substrate to electronic connectors and is then conducted to a printed circuit board on which the substrates are mounted. The substrate and board supporting frames preferably have fins for air cooling.

In another embodiment, arrays of transmitters and receivers face each other through the vias, allowing parallel communication between substrates.

BRIEF DESCRIPTION OF THE DRAWINGS

The accompanying drawings illustrate embodiments of the invention and together with the description serve to explain the principles of the invention.

DETAILED DESCRITPION OF THE DRAWINGS

Figure 1:
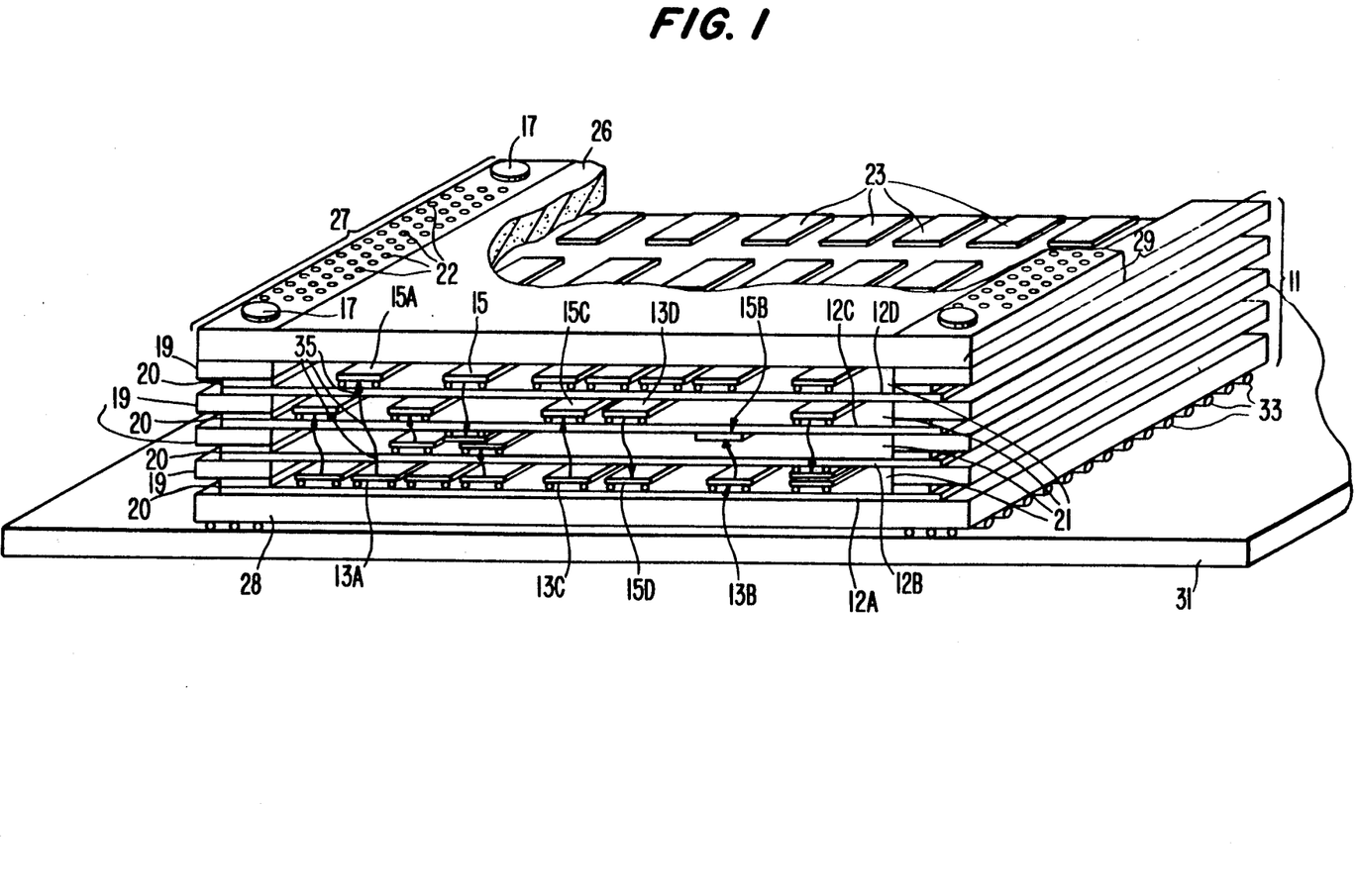
FIG. 1 is a perspective view of a stack of chip bearing substrates with optical vias permitting optical communication between transmitters and receivers directly facing each other and separated by one or more intervening substrates.

Referring to FIG. 1, the preferred embodiment of the invention is shown. Arranging substrates in a closely spaced, stacked three-dimensional relationship minimizes the space required as well as the signal path length between substrates. A stack 11 of substrates 12 with transmitters 13 and receivers 15 mounted thereon are aligned substrate by substrate and locked in position with lock down screws. The substrates 12 are separated by spacers 19 leaving spaces 21 for chips 23 mounted thereon for heat removal. The spacers 19 are preferably composed of a material such as silicon carbide to aid in heat transfer from the substrates 12. They also help maintain a parallel relationship between the substrates 12 within the stack. Conductive elastomer electrical connectors 20 provide electrical connections between pads located at the edge of the substrates 12. Interlevel electrical connections 22 are oriented vertical through the stack 11 and provide power and control signals between the substrates 12 and circuit board. Lid 26 and base 28 composed of a similar material as the spacers 19 add mechanical integrity to the stack 11 and allow electrical and heat sink connections. In the embodiment depicted in FIG. 1, the substrates 12 are formed from silicon.

Chips 23 which includes transmitters 13 and receivers 15 mounted on the substrates 12 include optical, optoelectronic, or electronic devices. Depending on their function, the chips 23 are predominately composed of semiconductor materials including silicon, GaAs, and GaAlAs with suitable dopants, dielectrics and conductive materials. Mounting and electrical connection of the chip 23 to the substrates 12 is by a conventional technique, flip chip controlled collapse chip connect (C4) solder joining by reflow method. Flip chip connections are preferred as they will self-align during the reflow process to the substrate due to the effects of surface tension of the molten solder. However, other embodiments of the invention use tab bonding, or wire bonding for chip join.

In this embodiment, substrates 12 are 25 mils thick, chips 23 mounted thereon are 15 to 20 mils thick, and spacers 19 provide a space 25 to 100 mils in thickness. The stack 11 is mounted on a circuit board 31, which provides electrical connections 33 to the substrates 12 in the stack 11 by wiring methods known in the art, including tab bonding and wire bonding. In FIG. 1, surface mount technology bonding is depicted.

Transmitters 13 convert the electrical signals from the processor and memory chips 23 on the respective surfaces of the substrates 12 to optical signals which are transmitted to receivers 15 located on other substrate surfaces within the stack 11. Among the devices usable for the transmitters 13 are lasers or light emitting diodes (LEDs), and electronic circuits that provide inputs driving the lasers or LEDs. Several suitable types of these devices are known in the art. The term light emitting device or transmitter is intended include a variety of devices from which optical signals are emitted in a range of wavelengths including those in the visible and infrared spectrum. A typical LED is an InGaAs/P LED with a 1.3 um wavelength. The lasers may emit light parallel to the surface of the substrate supporting them or perpendicularly through the top surface of the laser chip, both types known in the art. In the first case, means to direct the light perpendicularly to the surface of the substrate is included.

Receivers 15 convert the optical signals generated by the transmitters 13 into electrical signals for processing by the processor or memory chips 23 mounted on the respective surfaces of the substrates 12. One group of devices used for the receivers 15 are photodiodes, of which various types are known including junction diodes, PIN diodes, Schottky barrier diodes, GaAs metal-semiconductor-metal photodiodes, and heterojunction diodes. Other receivers 15 also include photoconductors and phototransistors. The transmitter 13 and receiver 15 should be matched to emit and sensitively receive the same wavelength. The emitted light should be of sufficient intensity to activate the emitter. Because these optoelectronic components are known in the art, they will not be further discussed here.

Holes 35 in substrates 12B, 12C and 12D permits light emitted by a transmitter 13A on a first substrate 12A to be received by a receiver 15A on a second substrate 12D that is separated from substrate 12A by intervening substrates 12B and 12C. Also, the transmitter 13A and receiver 15A are separated by the second substrate 12D on which the receiver 15A mounted. Thus, second substrate 12D is also an intervening substrate. Holes 35 in the substrates may be formed by several methods including laser drilling, chemical etching, plasma etching, electron-beam etching, or ion-beam etching. In other embodiments of the invention, ceramic substrates are used. Holes in ceramic substrates may be formed in the ceramic material before firing. The general process for forming green sheets and firing them to form ceramic substrates is a technique known in the art and described in the H. D. Kaiser U.S. Pat. No. 4,169,001 assigned to the assignee of the present patent application, and hereby incorporated by references. Holes 35 range from about 25 um to about 500 um in diameter.

A transmitter 13B mounted on a substrate 12B may also shine directly on a receiver 15B located on an adjacent substrate 12C in this case, no via is needed.

In the illustration in FIG. 1, two of the substrates 12B and 12C carry predominantly memory chips, and the other two substrates 12A and 12D carry predominantly logic chips to form two central processing units. With shared memory at least two pairs of transmitters and receivers are needed for two-way communication between each communicating pair of substrates with at least one transmitter and one receiver located on each substrate. For example, transmitter-receiver pairs 13C, 15C, 13D, 15D allow processors chips on one CPU substrate 12A to communicate with memory chips on one memory substrate 12C. Communication between the substrates as shown allows the processor chips on each substrate 12A, 12B to gain rapid access to each other and to the banks of memory chips mounted on the nearby substrates 12C, 12D. Even greater speeds can be accomplished with greater numbers of transmitter-receiver pairs. A useful design includes blocks of nine transmitters and receivers to transmit 8-bit information, with one parity bit, between substrates. For example, four such blocks of transmitters and receivers could be distributed on selected sites on the substrates for 32-bit communication.

Also shown in FIG. 1, heat is removed from the chips 23 by conduction through the substrates 12 to the spacers 19 to the lid 26 and the base 28 which may be further connected to other heat sinks, which is convectively cooled by a flow of air or water. Alternate methods of withdrawing heat from the chips 23 include forced fluid convection in the spaces 21 between the substrates 12 in which the fluid includes fluorocarbon such as FC77, water, or such gases as air, helium, or nitrogen. Heat can also be removed by other methods including a microchannel cooling method introduced by D. B. Tuckerman and F. Pease in U.S. Pat. No. 4,573,067 entitled "Method and Means For Improved Heat Removal In Compact Semiconductor Integrated Circuits" issued Feb. 25, 1986.

Figure 2:
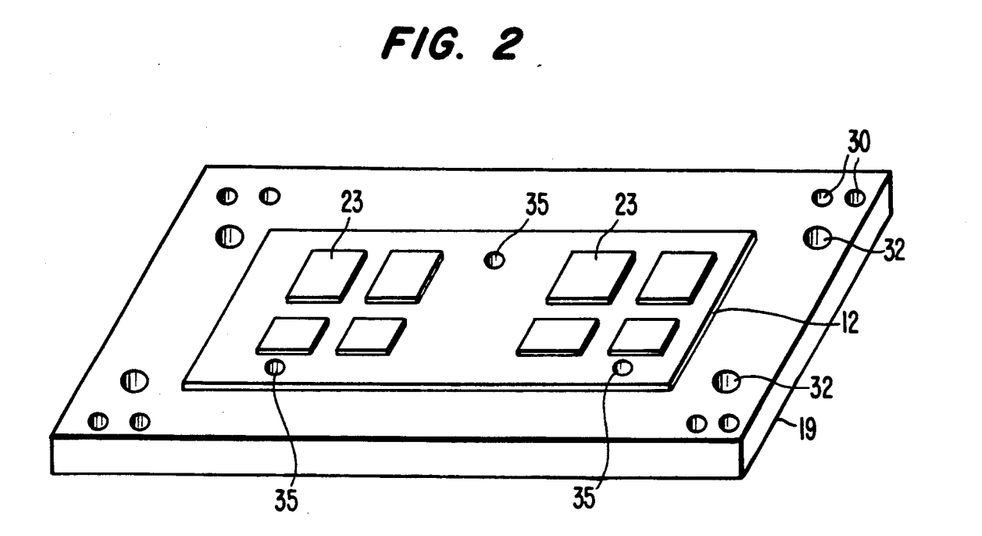
FIG. 2 is a perspective view of a single chip bearing substrate mounted on a spacer for inclusion in the optoelectronic package depicted in FIG. 1.
Figure 2A:
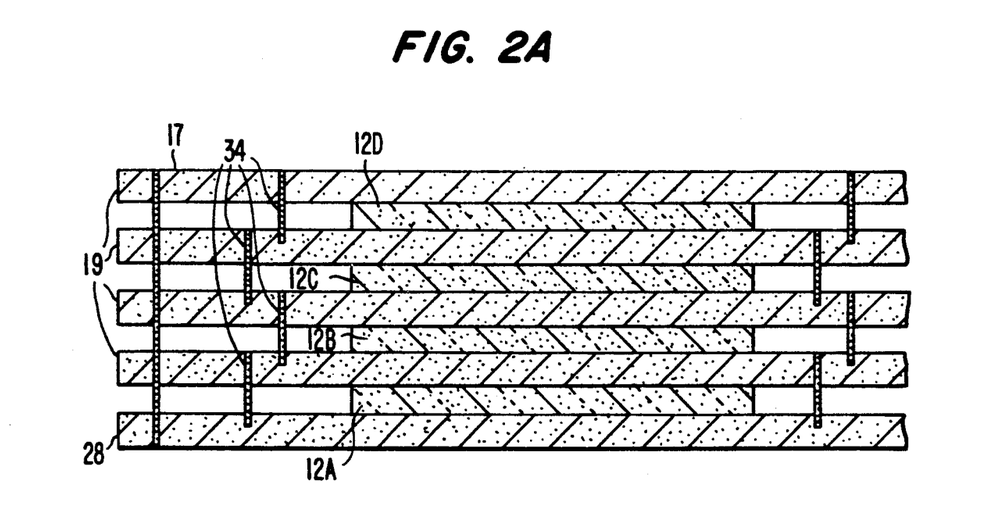
FIG. 2A is a cross-sectional view of a stack of chip bearing substrates and the alignment means used to align the transmitters and receivers on the substrates.

Several methods of aligning the substrates are possible. One scheme, illustrated in FIGS. 1 and 2A, and uses three alignment pins (not pictured). Two pins are placed through the substrate 12 through alignment holes 35 on one side 27 and a third pin is on an opposite side 29 of the substrate. It is known in the art that such a three point scheme provides reproducible alignment if the same three points were used to align features on each substrate during its manufacture. The holes 35 used for the alignment pins can be incorporated as part of the substrate metallization pattern for accurate positioning. An alternative method uses precisely positioned holes laser drilled through all the substrates 12. The first substrate 12A the first spacer 19A and the second substrate 12B are assembled, achieving a rough alignment. Further alignment may be accomplished by finely adjusting substrate position to maximize the intensity of light from transmitters shining through vias onto receivers. After the fine adjustment, the substrates are locked in position by tightening intermediate lock down screws 34 through holes 30. As the third and fourth substrates 12C, 12D are added to the assembly, the fine adjustment and lock down is repeated. After alignment of the stack 11 is complete, stack lock down screws 17 are placed through holes 32 and alignment pins are removed. Other alignment techniques would occur to those skilled in the art. Relatively precise alignment of the substrates 12 to each other is necessary to assure communication between transmitters and receivers on different substrates.

Figure 2B:
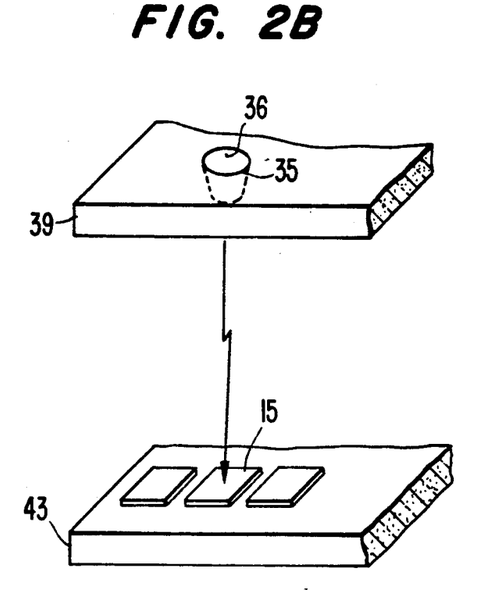
FIG. 2B is a perspective view of an intervening substrate having a funnel shaped optical means and an underlying substrate having a receiver mounted thereon showing the transmission of light through the optical means.

FIG. 2B shows a substrate 43 which is predominately composed of such materials as silicon, GaAs, alumina, ceramic, glass, diamond, or glass-ceramic. Substrates are preferably square or rectangular in shape and range in size from about 1 inch to about 12 inches along a side. A six-inch square silicon substrate is a preferred size and shape. Other shapes and sizes are encompassed by the present invention. As previously mentioned, silicon substrates are preferred because of the industry expertise with silicon and are already being produced for military hardware. They provide excellent thermal matching with silicon chips. However, in the future, diamond substrates will be available and will provide excellent thermal conductivity and are transparent to most wavelengths of light. Active devices may be included in the semiconducting substrates. Means described above for mounting and electrically connecting chips 23 to the substrate 43 are included. Conducting lines embedded in insulator on the base material of the substrate 12 electrically interconnect the chips 23 mounted thereon and provide means for electrically connecting the substrate 12 to an external network. Insulators include such materials as polyimide, glass, silicon nitride, diamond, and aluminum nitride. The conducting lines may also be embedded in the substrate if it is formed of such materials as ceramic or glass ceramic. As described in this invention, means for optically connecting the substrate to other components are also included.

FIG. 2B also shows an enlarged view of a laser-drilled hole 35 in a substrate 39 which is the preferred means of allowing light to pass through an intervening substrate. In this case, light emitted by a transmitter passes through the hole 35 in the substrate 39 to the receiver 15. The receiver is electrically connected to a substrate 43. If a gas ambient is used, the index of refraction is near 1, and the speed of light is maximized. The hole may have various shapes, including cylindrical, rectangular, and pyramidal. Illustrated in FIG. 2B is a funnel shaped hole or via 35 to collect more of the light from the transmitter and more effectively guide the light through the via 35 to the receiver 15.

The funnel shaped via 35 is preferably formed by one of two methods utilizing technologies known in the art. The first varies the focus or intensity of the high powered laser during the drilling of the hole through a substrate. For a silicon substrate, a high-powered laser such as an Nd:YAG or $CO_2$ laser is used. The tapered hole can be formed by pulsing the laser beam at a frequency of 1-3 Khz and a power of 2-4 watts. The laser can also be used to contour drill the silicon by moving the laser beam barrel which leaves a very circular hole. The second method is by a chemical etch process. The formulation of a funneled via in a silicon by a reactive ion etch (RIE) using a tapered resist profile or by implanting the site of the via prior to etch such that the doped portion will etch faster. Also, a wet etch chemical etch can be used to create a funnel-shaped profile if it will not otherwise damage the substrate.

After formation, the interior surface of the via 35 is coated with a reflective material 36 such as metal or with a dielectric film reflector. Methods are known in the art to deposit both types of reflector materials, including evaporation, sputtering and chemical vapor deposition. The thickness of the dielectric film reflector is chosen to be one half the wavelength of light emitted by the transmitter is in the dielectric. Thus, the reflective walls of the funnel shaped via act like a free space wave guide; the funnel shape concentrates the light to pass through the shaft of the hole, while the reflective walls maintain the intensity of the light as it reflects off the sides of the via.

Figure 3:
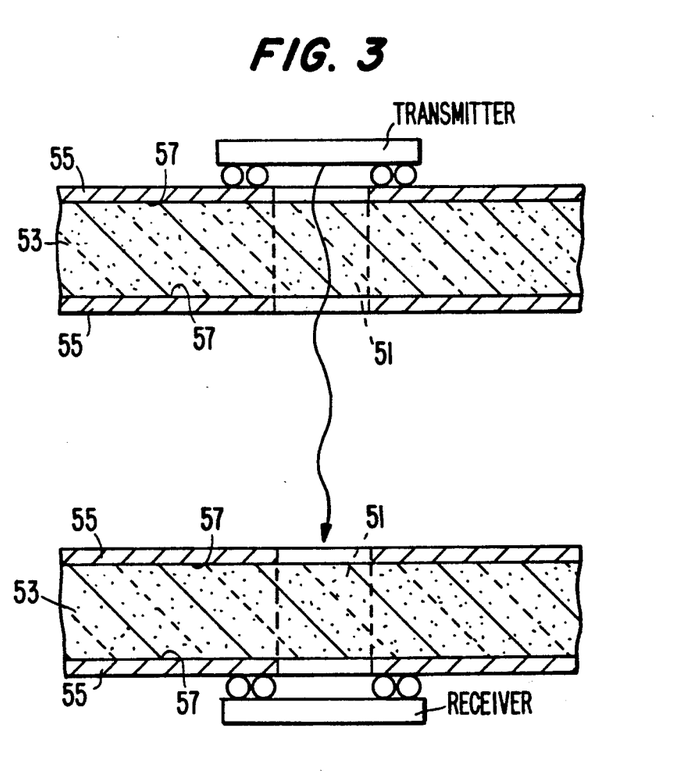
FIG. 3 is a cross-sectional view on a much enlarged scale showing transmission of light through a transparent region in an intervening substrate.

Referring to FIG. 3, an alternate embodiment of a via 51 is shown formed from a silicon substrate 53 without a drilled hole. Silicon is transparent to light with a wavelength greater than 1.1 micrometers, the wavelength corresponding to the bandgap of the semiconductor. Light of shorter wavelength is absorbed, and light with wavelength longer than 1.1 micrometer is transmitted through the silicon substrate with little absorption. The major losses would be caused by Fresnel reflections at the surfaces of the silicon substrate, but these are greatly reduced by antireflective coatings 55 on both surfaces 57 of the transparent region. Antireflective coatings are well known in the art; typically, antireflective coatings are a film or a plurality of films of transparent material whose index is intermediate between those of the adjacent layers and whose width is a quarter of the wavelength of the light in that film or an odd multiple thereof. A pattern of metal or other absorbing material having a central hole may be placed around the optical path to prevent the divergence of the light beam. If the light beam is not controlled and there are several receivers proximate to the optical path, a receiver for which the transmitted signal is not intended may receive spurious signals.

In the diamond or glass substrates used in alternative embodiments, visible wavelengths of light may be used for communication between substrates.

Figure 4:
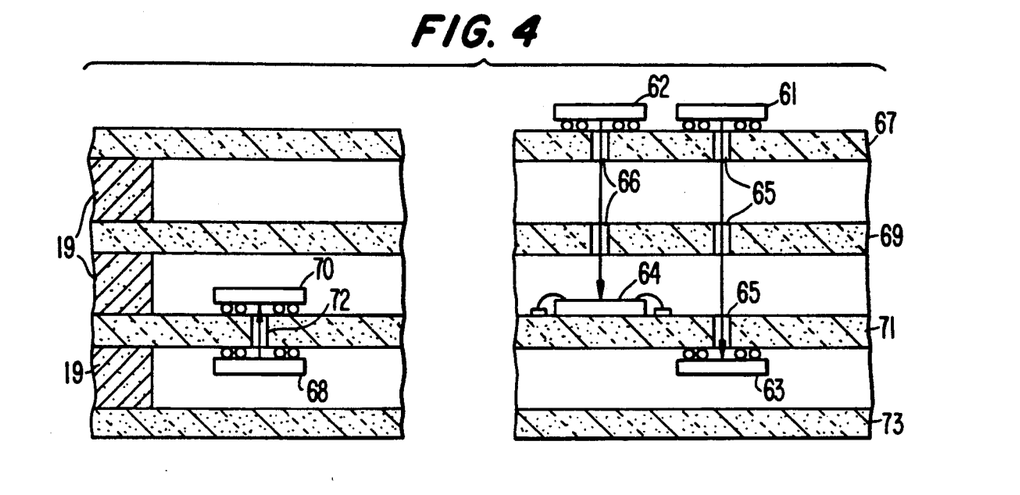
FIG. 4 is a cross-sectional view showing a transmitter chip mounted with flip chip controlled collapse chip connect (C4) solder point by reflow method, and located astride an optical via.

Referring to FIG. 4, a flip chip, C4-mounted transmitter 61 is shown. As mentioned previously, C4 mounting provides very precise chip positioning on the substrate, simplifying alignment. The transmitter emits light through vias 65 in a set of intervening substrates 67, 69, 71 to a flip chip mounted receiver 63 mounted on a substrate 71. As shown, the substrates 67, 71 on which the transmitter and receiver chips 61, 63 are mounted are themselves intervening substrates and must have vias 65. Flip chip technology is known in the art and was described described in the L. F. Miller U.S. Pat. No. 3,429,040 assigned to the assignee of the present patent application. Flip chip technology is preferred because of the automatic alignment capabilities of the chip to substrate. However, most known optical devices have their light emitting and light detecting features on the same side as their solder connections. Thus, optical communication between the top surfaces or bottom surfaces of the substrates becomes complicated. To communicate between the top surface of substrate 67 to the top surface of substrate 71, a wire or tab bonded receiver or transmitter could be used. As shown in FIG. 4, transmitter 62 communicates with wire bonded receiver 64 through vias 66. Wire-or tab-bonding is not advantageous from an alignment standpoint, however. Alternatively, transmitter 61 can communicate-to receiver 63 which sends electrical signals to transmitter 68 which communicates to receiver 70 on the top surface of substrate 71 through via 72. Another alternative is to modify the known optical devices by providing C4 solder pads on their back sides which electronically communicate through the chip. Yet another alternative is form the transmitters and receivers directly on or in the substrate.

Figure 5:
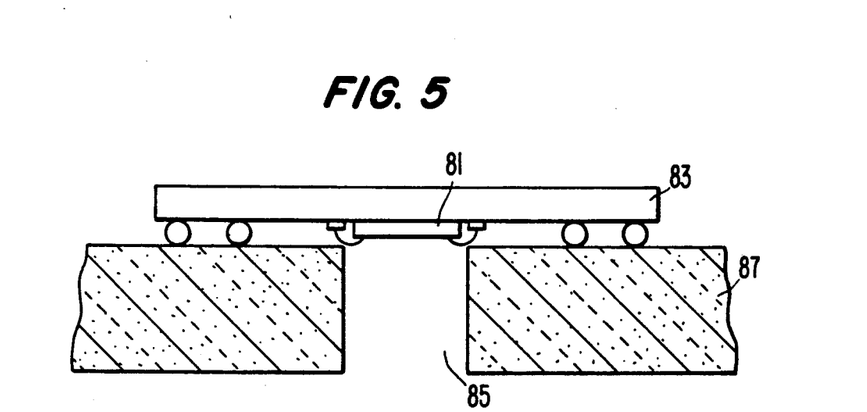
FIG. 5 is a cross-sectional view showing a receiver chip mounted with C4 joints and located astride an optical via.

Referring to FIG. 5, a discrete receiver 81 is mounted using wire bonding to a flip chip 83, which in turn is mounted over a via 85 in a substrate 87. A similar arrangement of a transmitter on a flip chip is also encompassed by the present invention.

Figure 6:
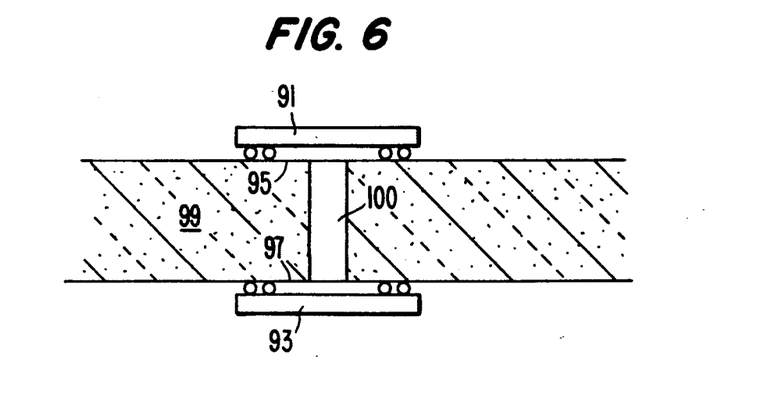
FIG. 6 is a cross-sectional view showing optically active chips located astride an optical via and mounted on both faces of a silicon substrate by means of C4 joints.

Referring to FIG. 6, an optical transmitter 91 is mounted on a first surface 95 of a silicon substrate 99, and an optical receiver 93 is mounted on a second surface 97 of the same substrate 98. Data are transmitted, from transmitter to receiver through an optical via 100 formed in the substrate 99 that carries both transmitter and receiver chips 91 and 93. Mounting chips on both sides of the silicon substrate 99 allows a significantly higher density of chips to be integrated in a single package, further improving the speed at which data are transmitted between chips.

Figure 7A:
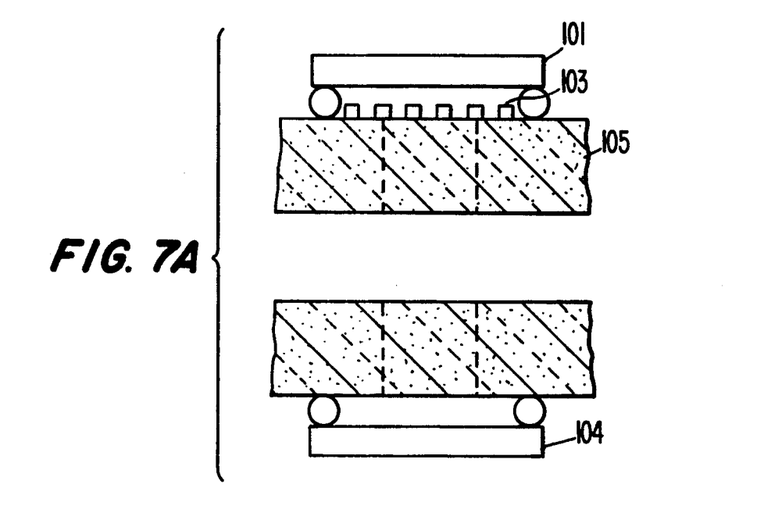
FIGS. 7A and 7B are a cross-sectional and a top view showing a laser and an integrated lens.
Figure 7B:
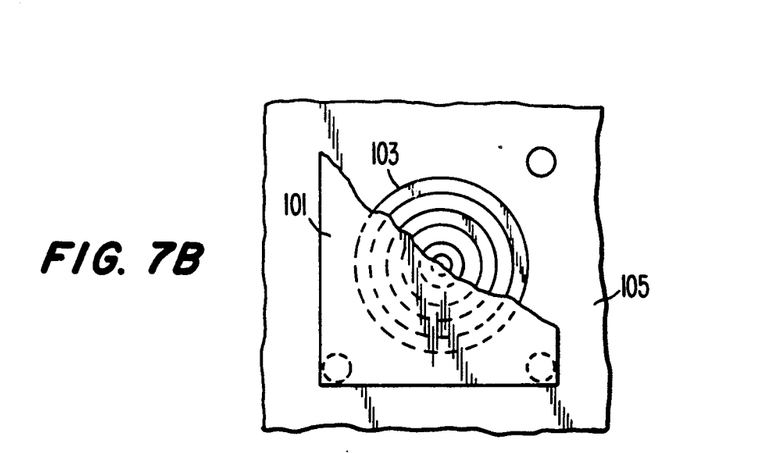

Referring to FIGS. 7A and 7B, an optical transmitter 101 is shown in cross-sectional and top views with a lens 103 to direct the light diverging from the transmitter 101 into a beam directed toward or focused on the receiver 104. The lens 103 is integrated into the substrate 105 on which the transmitter 101 is flip chip mounted. Light emitted by LEDs and semiconductor lasers typically has a large angle of divergence. Also, the divergence angle varies, widest in the plane of the pn junction of the emitter. In optical fiber transmission methods, the fiber used to connect transmitter and receiver is usually located close enough to the laser to couple most of its light, and a lens may be used to increase the coupling. Though the light is reflected many times in the fiber, the mechanism of total internal reflection ensures that a large fraction of the light output of the transmitter reaches the receiver. The lens 103 avoids a large divergence angle redirecting the diverging light onto the receiver on the nearby substrate. A Fresnel lens is schematically illustrated. Other concentrating means suitable for use in the present invention, include gradient index, curved surface refractors, reflectors, planar, Fresnel, microlens arrays, and diffractive optical elements.

Figure 8:
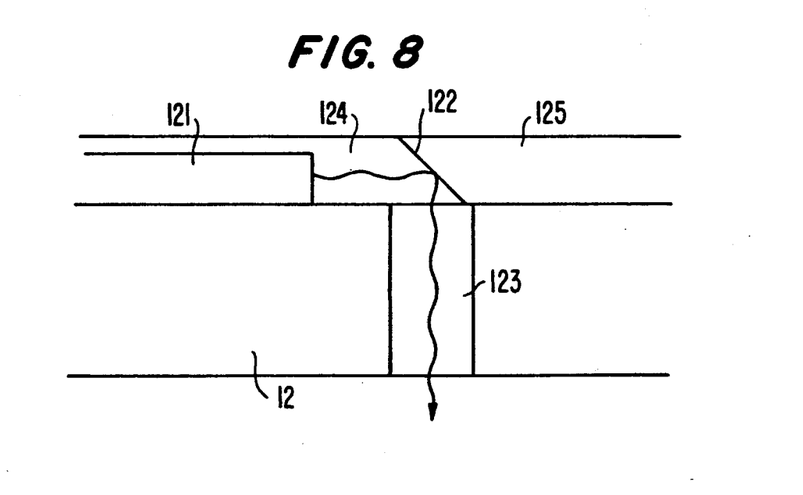
FIG. 8 is a perspective view showing a laser emitting in a direction parallel to the surface of the substrate and showing the beam deflected through a via along the optical path to a receiver.

An alternate embodiment of the transmitter is presented in FIG. 8. A laser 121 emits light parallel to the surface of a substrate 12. The light is deflected by a mirror or total internal reflector 122 through a via 123. If the light is deflected at interface 122 by internal reflection, the laser 121 is embedded in a relatively high index transparent material 124 compared to low index material 125. If the light is deflected by a mirror, interface 122 has a reflective metal film deposited thereon. Lasers of this type are commercially available and deflectors of this type are known in the art and described in the J. M. Leas U.S. Pat. Nos. 4,901,329 and 4,971,927 assigned to the assignee of the present patent application.

Figure 9:
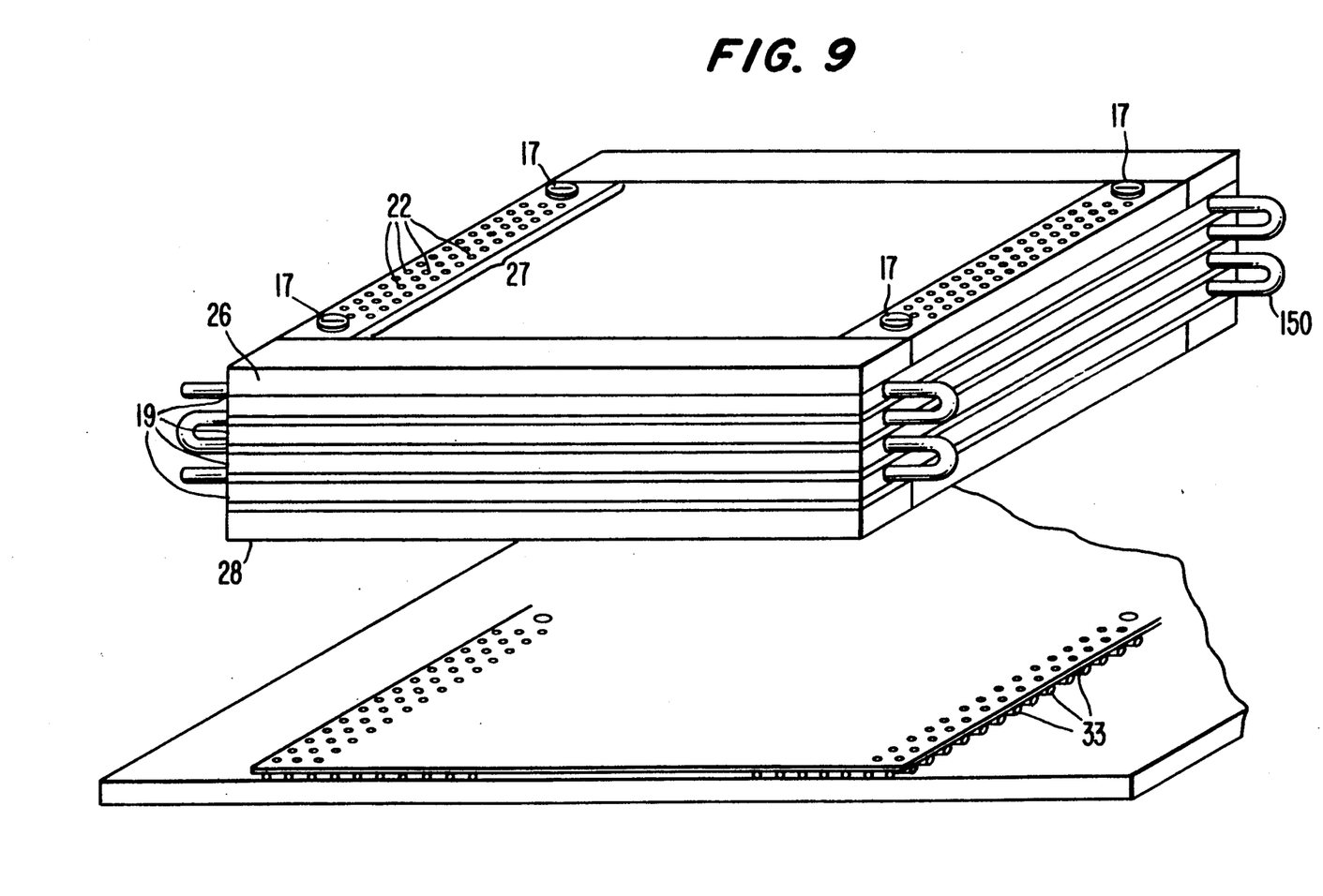
FIG. 9 is a perspective view showing the spaces between substrates wherein a fluid is used for heat removal and showing the heat sinks located at the four edges of the substrate stack.

In FIG. 9, spacers 19 incoporate cooling channels 150 to further improve heat transfers from the substrates 12 using an external cooling fluid. Several fluids may be used including air, nitrogen, helium, freon, and water. A liquid coolant would generally remove heat more efficiently. Fluid may also be forced through the spaces between substrates, providing more heat removal capability. Materials such as silicon carbide and aluminum nitride for the spaces 19 are particularly suitable for conducting heat.

Figure 10:
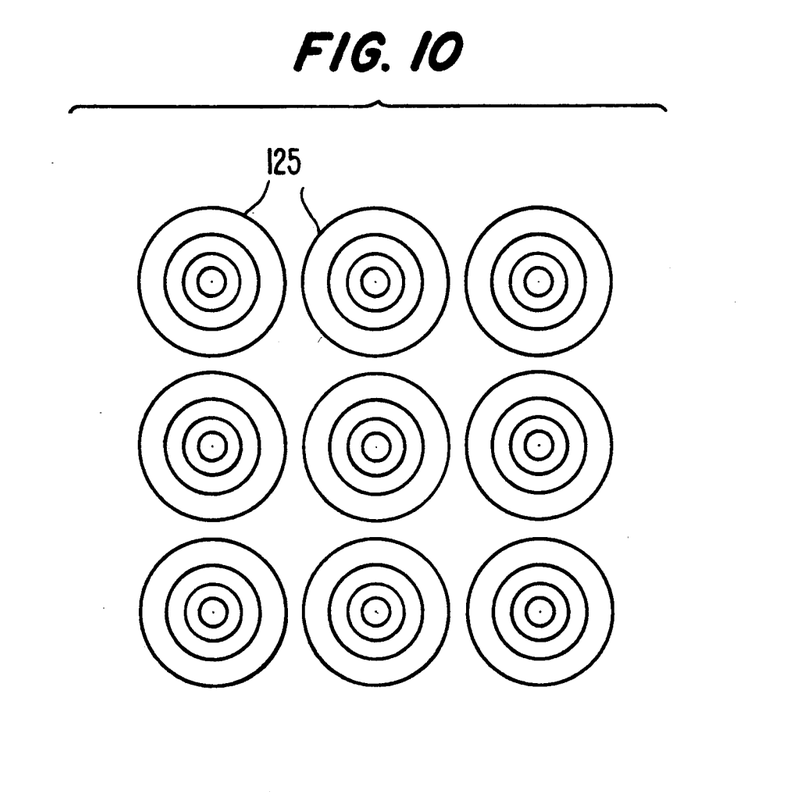
FIG. 10 is a top view showing an array of lenses formed in a silicon substrate.

A 3×3 array of lenses 125 is presented in FIG. 10. The lenses 125 are phase reversal zone plate lenses formed on a silicon substrate using standard planar processing methods including the growth of silicon dioxide to form the phase reversal zones. In one embodiment, the lenses 125 in the array are spaced a minimum of 250 um apart and function as focusing elements for a similarly spaced array of transmitters and receivers. The substrate on which the lenses are formed is one on which the transmitters are flip chip mounted. It may be also a substrate otherwise intervening between a plurality of transmitters and receivers. An array of transmitters and receivers provides several advantages, including a parallel communication link, significantly increasing the rate data is communicated.

While several embodiments of the invention, together with modifications thereof, have been described in detail herein and illustrated in the accompanying drawings, it will be evident that various further modifications are possible without departing from the scope of the invention. For example, means for external optical communication by optical fiber or free space between substrate stacks or other components within the computer can be incorporated into each substrate stack. Those skilled in the art would find many obvious equivalents to those listed above Nothing in the above specification is intended to limit the invention more narrowly than the appended claims.

We claim:

1. An optoelectronic package providing free space optical communication between a plurality of substrates arranged in a stacked, spaced relationship each substrate in the package having devices mounted thereon, the package comprising:
    a first substrate having substantially parallel first and second surfaces;
    a first light emitting transmitter mounted on the first surface of the first substrate;
    a second substrate having substantially parallel first and second surfaces, the surfaces of the first and second substrates oriented in substantially parallel directions;
    a first optical receiver mounted on the second surface of the second substrate, the first transmitter and first receiver oriented along an optical path so that light emitted by the first transmitter can be received by the first receiver, the optical path allowing free space optical communication between the first transmitter and first receiver;
    a third substrate having substantially parallel first and second surfaces oriented in a substantially parallel direction to the surfaces of the first and second substrates, the third substrate located between the first and second substrates along the optical path having an optical means to allow light to pass through; and,
    means to hold the first and second substrates so that the first transmitter and the first receiver are located along the optical path.

2. An optoelectronic package as recited in claim 1 further comprising:
    a second optical receiver mounted on the first surface of the first substrate;
    a second light emitting transmitter mounted on the second surface of the second substrate, the second transmitter and the second receiver located along a second optical path so that light emitted by the second transmitter is received by the second receiver in a free space optical communication; and,
    the third substrate having an optical means to allow light to pass through the second optical path;
    so that the first and second transmitter and receiver provide two-way optical communication between the devices on the first surface of the first substrate and the devices on the second surface of the second substrate.

3. An optoelectronic package as recited in claim 2 which further comprises:
    aligning means to align the substrates to assure optical communication between the first transmitter and receiver;
    spacing means between the substrates to maintain the substrates in a spaced parallel relationship;
    a circuit board having electrical connections with the substrates; and,
    a frame connected to the periphery of the substrates to remove heat from the substrates;
    wherein the optical means are funnel shaped holes with reflecting walls.

4. An optoelectronic package as recited in claim 1 further comprising means for aligning said substrates.

5. An optoelectronic package as recited in claim 1 wherein the substrates are mounted on a printed circuit board.

6. An optoelectronic package as recited in claim 1 which further comprises additional electronic, optoelectronic, or optical components mounted on the first surface of the first substrate and second surface of the second substrate.

7. An optoelectronic package as recited in claim 1 wherein the substrates are predominantly formed from a semiconductor.

8. An optoelectronic package as recited in claim 7 wherein active devices are formed in at least one of the substrates.

9. An optoelectronic package as recited in claim 1 further comprising means to focus the light from the first transmitter onto the first receiver.

10. An optoelectronic package as recited in claim 9 wherein said means is a lens.

11. An optoelectronic package as recited in claim 1 wherein the optical means is a funnel shaped hole with reflecting walls.

12. An optoelectronic package as recited in claim 1 wherein the optical means is a region of the substrate transparent to the wavelength of light emitted by the first transmitter and said region has an antireflective coating.

13. An optoelectronic package as recited in claim 12 wherein the third substrate is composed of a semiconductor material and the first transmitter emits light with a wavelength longer than the wavelength of a semiconductor bandgap.

14. An optoelectronic package as recited in claim 1 further comprising:
 a first plurality of transmitters mounted on the first surface of the first substrate;
 a first plurality of receivers mounted on the second surface of the second substrate in optical communication with said first plurality of transmitters;
 a second plurality of transmitters mounted in the second surface of the second substrates;
 a second plurality of receivers mounted on the first surface of the first substrate in optical communication with the second plurality of transmitters; and,
 optical means in the third substrate to allow light from each transmitter in the first and second pluralities of transmitters to pass through the third substrate to an appropriate receiver in the first and second pluralities of receivers, the pluralities of transmitters and receivers providing parallel communication channels between the first and second substrates.

15. An intervening substrate fo use in an optoelectronic package having substrates arranged in a stacked spaced relationship, providing free space optical communication between devices mounted on a first and a second substrate surface of a first and second substrate respectively, the first substrate surface having a first light-emitting transmitter mounted thereon, the second substrate surface having a first optical receiver mounted thereon, the transmitter and the receiver located along an optical path so that light emitter by the transmitter is received by the receiver, the intervening substrate comprising an optical means formed of a funnel shaped opening in the intervening substrate, the opening being coated with a light reflective material, the opening located along the optical path allowing light to pass through the intervening substrate and at least one device mounted on at least one surface of the intervening substrate.

16. An intervening substrate as recited in claim 15 which further comprises:
 a second light emitting transmitter mounted on a first surface of the intervening substrate; and
 a second optical receiver mounted on the first surface of the intervening substrate;
 the transmitter and receiver located on respective optical paths to permit free space optical communication with a third transmitter and a third receiver mounted on a third substrate surface on a different substrate in the optoelectronic package.

* * * * *